United States Patent [19]

Nabors et al.

[11] Patent Number: 6,088,523

[45] Date of Patent: *Jul. 11, 2000

[54] METHOD AND APPARATUS FOR SIMULATING AN ELECTRICAL CIRCUIT DESIGN USING APPROXIMATE CIRCUIT ELEMENT TAPERS

[75] Inventors: Keith Shelton Nabors, Sunnyvale; Tze-Ting Fang, Palo Alto, both of Calif.; Jacob Keaton White, Belmont, Mass.

[73] Assignee: Cadence Design Systems, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/752,812

[22] Filed: Nov. 20, 1996

[51] Int. Cl.⁷ .................................................. G06F 15/60

[52] U.S. Cl. ........................................ 395/500.35

[58] Field of Search ................................ 364/488, 489, 364/490, 491

[56] References Cited

U.S. PATENT DOCUMENTS

| | | | |
|---|---|---|---|
| 5,313,398 | 5/1994 | Rohrer et al. | 364/468 |
| 5,379,231 | 1/1995 | Pillage et al. | 364/488 |
| 5,581,202 | 12/1996 | Yano et al. | 326/101 |
| 5,696,693 | 12/1997 | Aubel et al. | 364/490 |

OTHER PUBLICATIONS

Bracken et al,"Interconnect Simulation with Asymptotic Waveform Evaluation", 1992, IEEE Circuit Systems–I: Fundamental Theory and Applications, v39, n11, p. 869.

Dahlquist et al, Numerical Methods, 1974, Prentice Hall, Sections 5.8.3–5.8.4.

Elmore, "The Transient Response of Damped Linear Networks with Particular Regard to Wideband Amplifiers", 1948, Journal of Applied Physics, v19, p. 55.

Golub et al, Matrix Computations, Second Edition, 1989, Johns Hopkins University Press, pp. 476–481.

Gupta et al, "Domain Characterization of Transmission Line Models and Analyses", 1996, IEEE Computer Aided Design of Integrated Circuits and Systems, v15, n2, p. 184.

Horowitz, "Timing Models for MOS Circuits", 1983, Ph.D. Dissertation, Stanford Electronics Laboratories, Stanford University, Technical Report No. SEL83–003.

Hyatt, Engineering Electromagnetics, Third Edition, 1974, McGraw Hill, pp. 408–413.

Kahng et al, "Efficient Analyses and Models of VLSI and MCM Interconnects", submitted to IEEE VLSI Systems.

Kerns, "Stable and Efficient Reduction of Substrate Model Networks Using Congruence Transforms", 1995 IEEE/ACM International Conference on Computer–Aided Design, IEEE Computer Society Press, p. 207.

(List continued on next page.)

*Primary Examiner*—Kevin J. Teska
*Assistant Examiner*—Thuan Do
*Attorney, Agent, or Firm*—Lyon & Lyon LLP

[57] ABSTRACT

A method and apparatus for making electrical circuits having RLCG lines is disclosed. The method depicts a circuit element taper of a selected element type as dependent upon an accumulated circuit element quantity. The method matches projections of the circuit element taper with projections of an approximate taper. The approximate taper depends upon the accumulated circuit element quantity. At least one reduced quantity for circuit element quantities of the selected element type is obtained on the computer. The one reduced quantity can be arranged in a reduced RLCG line having approximately the same performance as the RLCG line. The present invention should be particularly useful in verifying timing specifications and during the making of integrated circuits.

34 Claims, 11 Drawing Sheets

OTHER PUBLICATIONS

Liao et al, "Capturing Time–of–Flight Delay for Transient Analysis Based on Scattering Parameter Macromedel", 1994, IEEE/ACM International Conference on Computer–Aided Design, Digest of Technical Papers, p. 412.

McCormick, Modeling and Simulation of VLSI Interconnections with Moments, 1989, Ph.D. Dissertation, Department of Electrical Engineering and Computer Science, Massachusetts Institute of Technology.

O'Brien et al. Efficient On–Chip Delay Estimation for Leaky Models of Multiple–Source Nets, 1990, IEEE Custom Integrated Circuits Conference, 9.6.1.

Pillage et al, "Asymptotic Waveform Evaluation for Timing Analysis", 1990, IEEE Computer Aided Design, v9, n4, p. 352.

Protonotarios et al, "Theory of Non–Uniform RC Lines Part I: Analytic Properties and Realizability Conditions in the Frequency Domain", 1967, IEEE Circuit Theory, v14, n1, p. 2.

Ratzlaff et al, "RICE: Rapid Interconnect Circuit Evaluator", 1991, 28th ACM/IEEE Design Automation Conference, Paper 33.1, p. 555.

Silveira et al, "Efficient Reduced–Order Modeling of Frequency Dependent Coupling Inductance associated with 3–D Interconnect Structures", 1995, 32nd Design Automation Conference, p. 376.

Stoer et al, Introduction to Numerical Analysis, 1980, Springer–Verlag, pp. 142–158.

Tang et al, "Analysis of High–Speed VLSI Interconnects Using the Asymptotic Waveform Evaluation Technique", 1992, IEEE Computer Aided Design, v11, n3, p. 341.

Rao, "Delay Analysis of the Distributed RC Line", 1995, 32nd Design Automation Conference.

Feldman et al, "Efficient Linear Circuit Analysis by Pade Approximation via the Lanczos Process", 1995, IEEE Computer–Aided Design of Integrated Circuits and Systems, v14, n5, p. 639.

Nabors et al, "A Gaussian–Quadrature Based Algorithm for RLC–line to RLC–line Reduction", Submitted to 1996 International Conference on Computer–Aided Design.

Nabors et al, "Lumped Interconnect Models Via Gaussian Quadrature", Submitted to the 1997 Design Automation Conference.

Borchers et al, "Reduction Parasiter RC–Netzwerke in Hochsintegrierten Schaltungen", 1993, Sixth EIS Workshop.

METHOD AND APPARATUS FOR SIMULATING AN ELECTRICAL CIRCUIT DESIGN USING APPROXIMATE CIRCUIT ELEMENT TAPERS

BACKGROUND OF THE INVENTION

The present invention relates generally to making electrical circuits and more particularly to testing electrical circuit designs. The present invention should be particularly useful in making integrated circuits.

Electrical circuits have become an integral part of many everyday devices in the home and industry. Consequently, entire industries are devoted to manufacturing electrical circuits, particularly integrated circuits. Improvements are constantly sought for the manufacturing process.

It is desirable to simulate performance of an electrical circuit before manufacture including verifying timing specifications. Timing verification can include calculating transmission delays along circuit conductors, and among combinations of the following: components, gates, input/output pads, input/output leads, etc.

Conventionally, verifying timing specifications can be an arduous, and often inaccurate, task. Although often idealized as perfectly conducting, actual wires and conductive connections are not. Instead, they provide some resistance to current flow. In addition, the wires and conductive connections may impart capacitive and inductive effects upon currents and/or signals passing through them. Collectively, these properties delay passage of currents and signals and thus distort associated rise and fall times.

Broadly speaking, three conventional timing verification schemes are commonly employed: circuit simulations, moment expansions, and combinations of circuit simulations and moment expansions. Timing approximations depend upon properties of wires and circuit elements within the electrical circuit. Because of this, timing verification schemes often intertwine with circuit reduction models which attempt to describe circuits by fewer circuit elements than in an original circuit description. By reducing a number of circuit parameters affecting a timing approximation, a computation of timing delays can be easier. Conversely, timing approximations can sometimes imply representative reduced circuits.

In the first conventional approach to timing verification, circuit simulators have circuit element values as inputs. A common input structure uses resistances and capacitances resulting from an resistive-capacitive (RC) model of the circuit or wire. Other models add in inductances (RLC) and conductances (RLCG). For some circuits, inductive-capacitive (LC) models may be useful.

RC models form chains of resistors in series and capacitors in parallel to represent wires and conductors within the circuit. Wires and other conductors have a resistance per unit length. In addition, as charge moves through the conductors, charge builds up along the conductors for short time periods implying a capacitance per unit length. The RC model's chains or "ladders" represent differential resistances and capacitances along the wires. Particularly when a width of wire varies along its length, the resistors in the chain can have differing resistances. RC models describe charges flowing into and out of the capacitors and through the resistors as a system of partial differential equations. Systems of partial differential equations are generally difficult to solve.

RC models are limited to low frequencies and currents. For higher frequencies or larger currents, or both, for a wire of a given width, they break down because other sources of signal delays arise. In essence, the wire becomes less able to quickly adjust to fast and large signal changes required by higher frequencies and larger currents.

An example of an additional source of signal delay is inductance. Essentially, differential charge buildups along the conductor cause currents to flow opposite a direction of changing current flow. For example, when current is applied to a wire, an inductive effect within the wire will induce a current in a direction opposite the applied current. When the applied current stops, i.e. is shut off, the inductive effects induce a current in the same direction as previous current flow essentially attempting to sustain the previous current flow. Inductive effects may be thought of as analogous to inertial effects resisting motion in the field of mechanics. Inductive effects are generally negligible for low frequencies and small currents. However, at high frequencies and/or large currents, inductive effects are no longer small enough to be neglected.

Higher frequencies are generally of interest as circuits are made to work faster at ever higher frequencies as in personal computers. Integrated circuits in such computers operate with fast clock signals. Ideally, clock signals are provided to all parts of the integrated circuit. Clock signals are very important and therefore are sent to parts of the integrated circuit over wires with wider effective cross sections. However, the wires are so wide that inductive effects tend to dominate delays rather than resistive or capacitive effects. Therefore, RC models are not very useful for determining delays of clock signals. This implies a need for an RLC model.

An RC, RLC, LC, or RLCG model of a wire can be input to a circuit simulator to determine circuit timing information. Circuit simulators use current constraints for nodes to create a system of ordinary differential equations between voltages and currents. Derivatives in the equations are discretized to create matrix equations. Transistors provide nonlinear amplifications, and thus their effects appear through non-linear terms in the ordinary differential equations and matrix equations.

Unfortunately, especially for long wires or many wires, a network modeled by the circuit simulators will have a huge number of resistances and capacitances as parameters. The values of R and C are approximated by resistances and capacitances per unit length based on cross-sectional shape, as well as width and depth, of a particular wire. The time for solution is roughly proportional to a number of nodes in the network raised to a power 1.5 implying very long simulation times. This is serious drawback of the circuit simulator approach.

In a second approach to timing verification, designers concentrate on inputs and outputs of circuits instead of intricacies of internal components and connections. Moment analysis is presently a popular way of doing this. A first moment is a weighted integral of an impulse response. Essentially, the first moment is the response midway through a rise of an input pulse. By comparing a time difference between the midpoint of the input voltage pulse and the first moment, a first approximation to the time delay for the wire is computed. In the art, this first approximation is called an Elmore delay. The second moment roughly corresponds to a slope of the response midway through the rise of the step input. Higher order moments give increasingly better fits of an approximate response to an actual response function.

In a basic scheme, a Laplace transform for an output voltage for a subcircuit is divided by a Laplace transform for an input voltage to a subcircuit. Each of the two Laplace transforms is a polynomial in the transformed variable typically denoted by "s." By dividing the polynomials, a polynomial expansion in s for a transfer function H(s) for the subcircuit is obtained.

The coefficients of the terms in the polynomials are the moments described above. Lower order basis polynomials have lower order moments as coefficients. For example, a constant term is the zeroth order moment. Likewise, a coefficient of a term linear in s is a first moment, and a coefficient for an $s^2$ is a second order moment. More explicitly $$H(s)=m_0+m_1s+m_2s^2+\ldots$$

where $m_0$, $m_1$, and $m_2$ are the zeroth, first, and second order moments.

Transfer function models generated by moment methods are often unstable. Circuit simulations using unstable models produce responses that grow without bound, even for bounded inputs. Such non-physical behavior is indicative of a "stability" failure. In addition, the subcircuit's transfer function is combined with other quantities in other subcircuits to integrate the reduced subcircuit with other subcircuits. For example, an inverse of the transfer function may be added to a resistance for a resistor in another subcircuit with the sum subsequently inverted. Unfortunately, combining even a stable moment-method transfer-function model with other circuit components, or other stable transfer-function models, can lead to an overall unstable model. This is a failure of "absolute stability."

The moment approach also breaks down for inductive effects. If a wire only has resistive and capacitive properties, a response to a step input is strictly increasing. Therefore, the integral of the response over time is strictly increasing as a function of time. When inductances are introduced, the response can be negative at first resulting from induced currents opposite the direction of an applied a current as described above. As the response to the applied step impulse current reaches its steady value, corresponding to a constant current of the step, the response may vary because of induced currents. This effect is termed "ringing" or "undershoot" and "overshoot."

In a third approach to timing verification, some designers combine the first two approaches in circuit-to-circuit reduction schemes. This approach uses moment calculations to replace R's and C's in circuit simulator calculations with fewer "reduced" R's and C's. By making a moment expansion for the original circuit or a subcircuit, reduced elements can be obtained which have the moments of the original circuit or subcircuit. Circuit simulations then obtain timing information from the reduced resistances and capacitances. A drawback of this scheme is that circuit elements in the reduced circuit are approximate and only match true values for an actual reduced circuit having the same functionality as the original RC circuit to a certain order.

FIGS. 1A–C illustrate a sample circuit-to-circuit reduction. In FIG. 1A, a wire 30 is connected to two other wires 32 and 34 and form a subcircuit 31 of an electrical circuit. Wire 30 is represented by a "ladder" or "chain" of resistors 36 in series and capacitors 38 in parallel in a representative circuit 35 in FIG. 1B. A sum of resistances for resistors 36 approximately equals a total resistance for the wire 30, and a sum of capacitors 38 approximately equals a total capacitance for the wire 30. The resistances 36 and capacitances 38 are computed from geometry of the wire 30. Similarly, wire 32 is represented by a ladder of resistors 40 and capacitors 42, and sums of resistances and capacitances equal total resistance and total capacitance for the wire 32. The wire 34 is represented by a chain of resistors 44 and capacitors 46. As with wires 30 and 32, a sum of resistors 44 equals the total resistance of the wire 34, and a sum of the capacitances equals the total capacitance of the wire 34.

A sample reduced or modified representative circuit 50 is formed by circuit-to-circuit reduction from the representative circuit 35. The reduced circuit 50 is shown in FIG. 1C. Wire 30 is represented in the reduced circuit 50 by fewer resistors 56 than resistors 36 in the original circuit 35. There are also fewer capacitors 58 than capacitors 38 in the original circuit. In like fashion, wire 32 has fewer resistors 60 and capacitors 62 than in the representative circuit 35, and wire 34 has fewer resistors 64 and capacitors 66 than in the representative circuit 35.

In summary, the conventional timing verification and circuit-to-circuit reduction schemes applied to wires have several drawbacks. Circuit simulators are very slow for many practical problems. Moment methods require detailed knowledge of circuit connections to simulate driving the electrical circuit and receiving response at specified points. As just noted, they are generally unstable. Both circuit simulators and moment methods have difficulty handling distributed circuit quantities such as resistance and capacitance per unit length on a wire. They also cannot model in a parametrized way coupling between wires in close proximity to each other which are not physically electrically connected. In addition, traditional circuit-to-circuit reduction is computationally very intensive and time consuming and approximates values for reduced circuit elements only to low order. Even so, the reduced circuits tend to still be rather large for most situations of practical interest.

SUMMARY OF THE INVENTION

The present invention is directed to a method of making an electrical circuit. The method includes providing design specifications for the electrical circuit. The design specifications include timing specifications. The method describes on a computer circuit element quantities and circuit connections for the electrical circuit. The computer description contains a description of an RLCG line within the electrical circuit. The method verifies the timing specifications for the electrical circuit by circuit-to-circuit reduction and produces the electrical circuit in accordance with the description on the computer.

The verification of timing specifications depicts a circuit element taper of a selected element type as dependent upon an accumulated circuit element quantity. The verification matches projections of the circuit element taper with projections of an approximate taper. The approximate taper depends upon the accumulated circuit element quantity. At least one reduced quantity for circuit element quantities of the selected element type is obtained on the computer.

The one reduced quantity can be arranged in a reduced RLCG line having approximately the same performance as the RLCG line. The verification simulates on the computer performance of a reduced circuit containing the reduced RLCG line to obtain timing information about the electrical circuit. The timing information is compared against the timing specifications.

The present invention also includes a method of RLCG line reduction. The method depicts a circuit element taper of a selected element type as dependent upon an accumulated circuit element quantity. The method matches projections of the circuit element taper with projections of an approximate taper. The approximate taper depends upon the accumulated circuit element quantity. At least one reduced quantity for circuit element quantities of the selected element type is obtained on the computer. The one reduced quantity can be arranged in a reduced RLCG line having approximately the same performance as the RLCG line In an article of manufacture aspect of the invention, a computer readable medium is disclosed. The computer readable medium includes program instructions for performing steps on a computer to implement the method of performing RLCG line reduction.

In an apparatus aspect of the invention, a system for making an electrical circuit is disclosed. The system includes a digital hardware description processor having a central processing unit (CPU), digital storage coupled to the CPU, and a user input device coupled to the CPU operable to describe circuit element quantities and circuit connections for an electrical circuit and associated mask data from the description and design specifications for a circuit received via the user input device. The design specifications include timing specifications. The description contains a description of an RLCG line within the electrical circuit.

The digital hardware description processor verifies the timing specifications for the electrical circuit by circuit-to-circuit reduction. The processor depicts a circuit element taper of a selected element type as dependent upon an accumulated circuit element quantity and matches projections of the circuit element taper with projections of an approximate taper. The approximate taper depends upon the accumulated circuit element quantity. The digital hardware description processor obtains at least one reduced quantity for circuit element quantities of the selected element type. The at least one reduced quantity can be arranged in a reduced RLCG line having approximately the same performance as the RLCG line. The digital hardware description processor simulates on the computer performance of a reduced circuit containing the reduced RLCG line to obtain timing information about the electrical circuit and compares the timing information against the timing specifications. The digital hardware description processor stores the associated mask data for the electrical circuit on the digital storage. The system also includes a mask generator coupled to the digital storage for making at least one circuit mask from the associated mask data stored in the digital storage.

The present invention has several advantages over conventional methods, apparatuses, and articles of manufacture. The invention does not require detailed knowledge of circuit connections to perform circuit-to-circuit reduction. Previous methods require simulating driving the electrical circuit and receiving response at specified points which in turn requires specific knowledge of circuit connections. The method produces stable reduced circuits regardless of circuit element type. Unlike previous methods, the present invention allows construction of parametrized coupled reduced circuits which are not electrically connected. This is the case when field effects of adjacent wires in effect connects them via capacitances. With the present invention, such capacitances are simply modeled as circuit elements multiplied by a parameter. The method is faster. For most circuits of practical interest on an integrated circuit, the reduced circuits have fewer elements than conventional circuit reduction methods. The present invention also readily models inductances without the stability problems of previous methods. Finally, the same method is used to reduce the original circuits regardless of element type.

DETAILED DESCRIPTION OF PREFERRED EMBODIMENTS

Although the following discussion will focus on embodiments using the present invention in the design and manufacture of integrated circuits, those skilled in the art will appreciate that the present invention can be applied to the design and manufacture of any wire model electrical circuit.

Several operations or steps are described below as performed on a "computer." Those skilled in the art will appreciate that although it may be convenient to perform multiple steps on one processor or central processing unit (C.P.U.), the invention does not require it. Indeed, it may be advantageous to perform some steps on one processor or C.P.U. and other steps on one or more other processors or C.P.U.'s. Therefore, the term computer should be construed to include multiple processors and C.P.U.'s which may be electrically or electromagnetically connected via one or more networks as well as those not connected as in multiple stand alone machines. Of course, data can be transferred between stand alone machines by floppy disks, tapes, CD-ROMS, etc.

Figure 2:
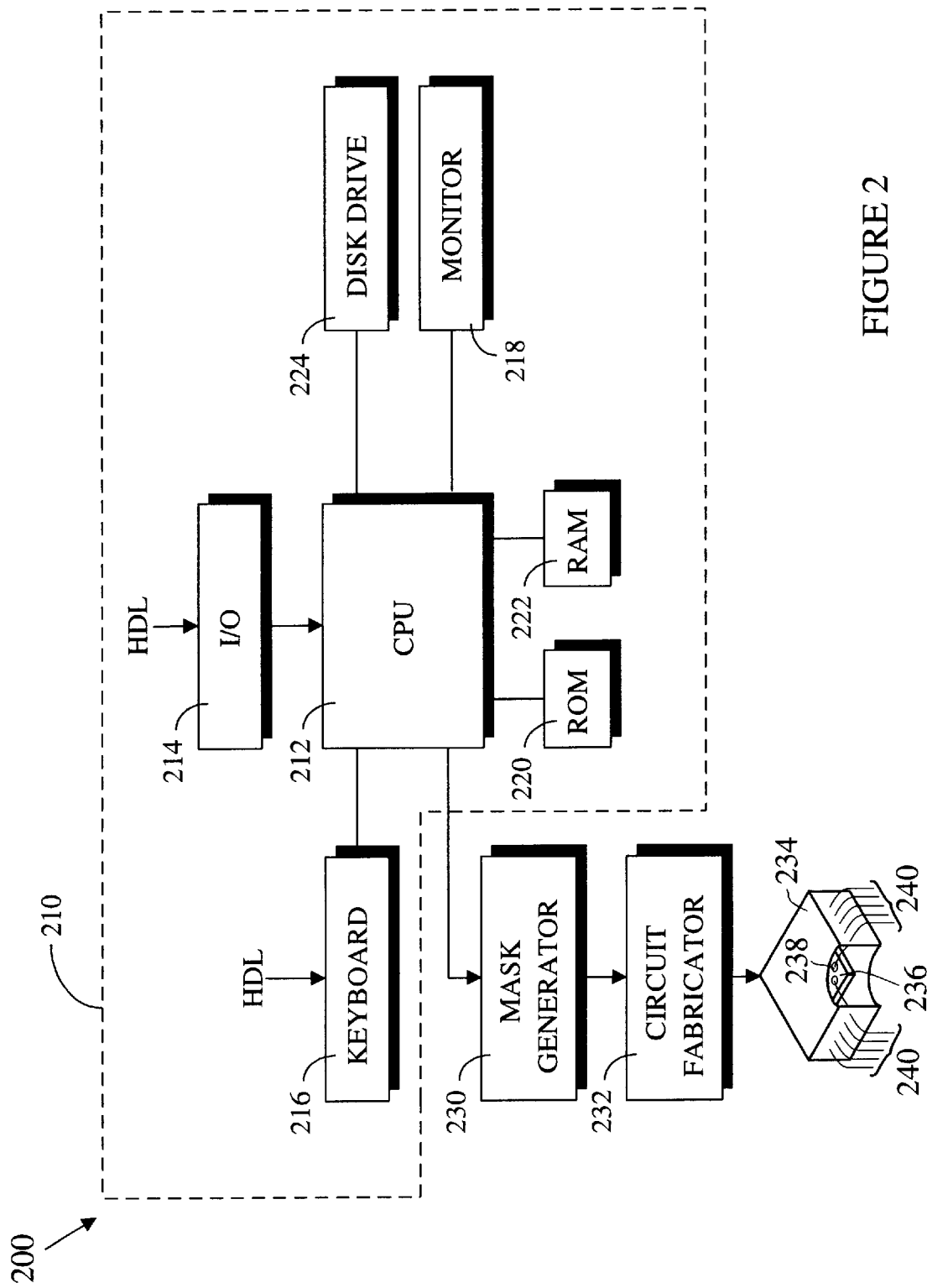
FIG. 2 is a diagrammatic representation of a system for making an electrical circuit in accordance with the present invention.

FIG. 2 shows a preferred embodiment of a system 200 for making an electrical circuit in accordance with the present invention. In further preferred embodiments, a method of RLCG line reduction for the electrical circuit and a method of making an electrical circuit run on the system 200 although these methods may run on other systems and computers. The system 200 includes a digital hardware description processor 210 and a mask generator 230. The digital hardware description processor 210 is an example of the computer on which the method of verifying timing specifications runs. The digital hardware description processor 210 includes a central processing unit (CPU) 212.

Design specifications are input to the system 200 and processor 210 via a user input device such as an input/output port 214 or a keyboard 216. The input/output port 214 may be linked to another processor which receives the design specifications from a user. Alternatively, the other processor develops the design specifications based on instructions given to it by the user. In preferred embodiments, the design specifications will be in a hardware description language (HDL) such as SpectreHDL™ or Verilog™. The design specifications include timing requirements or specifications, placement limitations, minimum distances between wires, maximum wire widths and depths, etc. for the electrical circuit. The timing requirements or specifications generally include maximum allowable delays between various connection points and components within the electrical circuit.

The user can view progress of the system and verify his/her inputs by viewing a monitor 218 coupled to the CPU 212. ROM 220, RAM 222, and a disk drive 224, such as a hard drive or floppy disk, are digital storage coupled to the CPU 212. Of course, another storage device such as a magnetic tape could be substituted for the disk drive 224.

The hardware description processor 210 is operable to describe circuit element quantities and circuit connections for the electrical circuit and associated mask data from the description and design specifications for the circuit received via the user input device. The description contains a description of an RLCG line 250 within the electrical circuit.

Figure 3A:
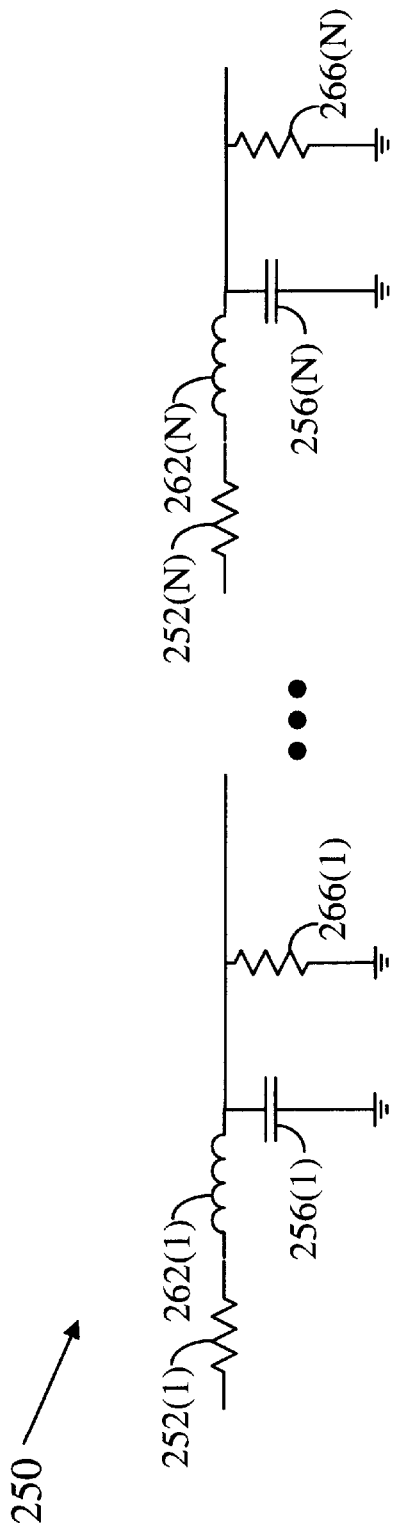
FIGS. 3A–B illustrate an RLCG line reduction in accordance with the present invention.

The term "RLCG line" is well-known to those skilled in the art. The generic RLCG line 250 is shown in FIG. 3A. As used herein, the term "RLCG" will be construed to include lines with non-zero resistance (R), inductance (L), capacitance (C), and conductance (G) as well as cases where any of the R, L, C, or G parameters are zero. For example, RC lines and LC lines are considered special cases of RLCG lines. Consequently, the RC chains and ladders discussed in the background section are examples of RLCG lines.

The RLCG line 250 models the wire by N canonical RLCG subcircuits. Resistors 252(J) and inductors 262(J), J=1, . . . , N, are in series. Shunt capacitors 256(J) and shunt conductances 266(J) are in parallel. For each subcircuit, i.e. each J, at least one of the circuit elements 252(J), 262(J), 256(J), and 266(J) is non-zero.

The hardware description processor 210 verifies the timing requirements for the electrical circuit by depicting a circuit element taper of a selected type as dependent upon an accumulated circuit element quantity. The circuit element taper is a derivative of a distribution of a circuit element quantity. Distributed resistance and capacitance on a wire are examples of distributed circuit element quantities. The accumulated circuit element quantity is an integral of another distributed circuit element quantity. The hardware description processor 210 also matches projections of the circuit element taper with projections of an approximate taper also dependent upon the accumulated circuit element quantity. By matching the projections, the processor 210 obtains one or more reduced quantities of the selected type.

Figure 3B:
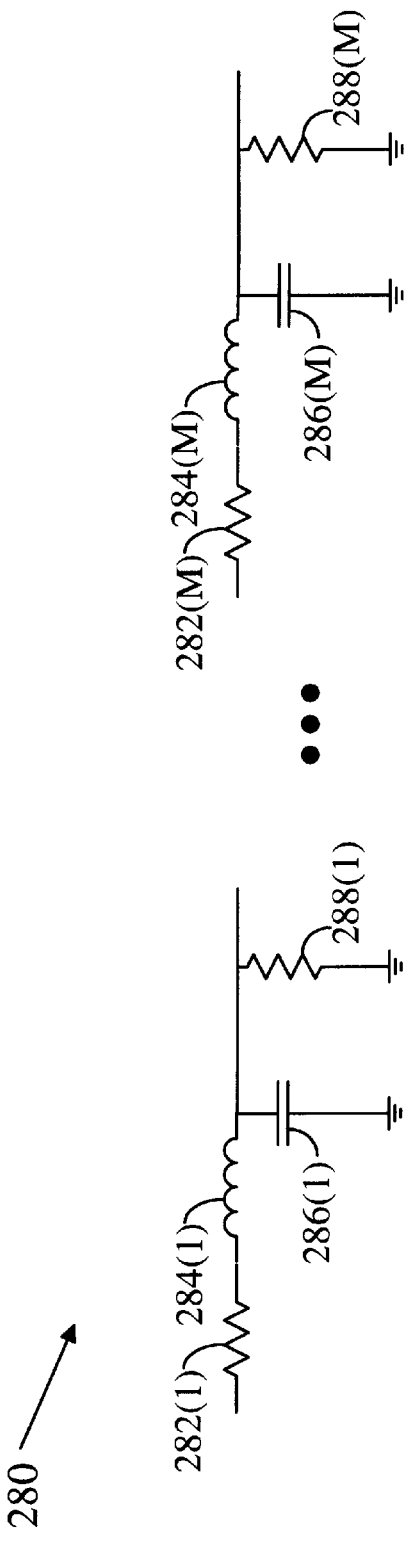

The reduced quantities can be arranged in a reduced RLCG line 280 having approximately the same performance as the original RLCG line 250 as shown in FIG. 3B. Inductors 284(I), I=1, . . . M, in the reduced RLCG line 280 replace the inductors 262(J), J=1, . . . , N the original RLCG line 250. Similarly, resistors 282(I), I=1, . . . M, in the reduced RLCG line 280 replace the resistors 252(J), J=1, . . . , N the original RLCG line 250. Likewise, capacitors 286(I), I=1, . . . M, in the reduced RLCG line 280 replace the capacitors 256(J), J=1, . . . , N, and conductances 288(I), I=1, . . . M, in the reduced RLCG line 280 replace the conductances 266(J), J=1, . . . , N.

In this scheme, a capacitance between wires in close proximity can be accounted for by a shunt capacitor in the RLCG line 250. Unlike conventional methods and apparatuses, the present invention does not require that the two closely spaced wires be electrically connected to describe the coupling. The present invention successfully accounts for the coupling between the wires.

By sequentially changing the selected type and corresponding circuit element taper, the hardware description processor 210 calculates reduced quantities for all circuit quantities in the RLCG line 250 which are different from the type to which the accumulated circuit element belongs. In some situations, there may be as many reduced quantities of the selected type as the original number of circuit element quantities selected for reduction.

To obtain the reduced quantities for the accumulated circuit element's type, a new accumulated circuit element quantity is chosen and calculated. A new circuit element taper of the same type as the previous accumulated circuit quantity is chosen. The previous procedure is then repeated with the new accumulated circuit element quantity, new circuit element taper, and new selected type.

The hardware description processor 210 simulates performance of a reduced circuit having the reduced quantities associated with reduced circuit elements contained in the reduced circuit to obtain timing information about the electrical circuit. The processor stores the associated mask data for the candidate electrical circuit topologies on the digital storage. Descriptions of the candidate topologies and the mask data are stored on digital storage coupled to the CPU 212, such as the RAM 222 or disk drive 224.

Software implementing the timing verification method on the system 200 turns the hardware description processor 210 into a timing verifier. The software may be stored in ROM 220, RAM 222, or the disk drive 224. The software may be input by the keyboard 216 or I/O port 214. Of course, the I/O port 214 can take the form of a floppy disk drive.

The mask generator 230 generates a circuit mask for the electrical circuit using the associated mask data. A circuit fabricator 232 uses the circuit mask to make the electrical circuit As depicted in FIG. 2, the circuit fabricator 232 makes an integrated circuit 234. The mask may be appropriate for making a printed circuit or an integrated circuit depending on the particular embodiment of the invention. In either case, photolithography uses the mask to form lead traces on a printed circuit board or semiconductor die 236. The integrated circuit 234 has input/output (I/O) pads 238 on the substrate 236. Leads 240 permit connecting the integrated circuit 234 containing the electrical circuit to external circuitry (not shown).

Figure 4:
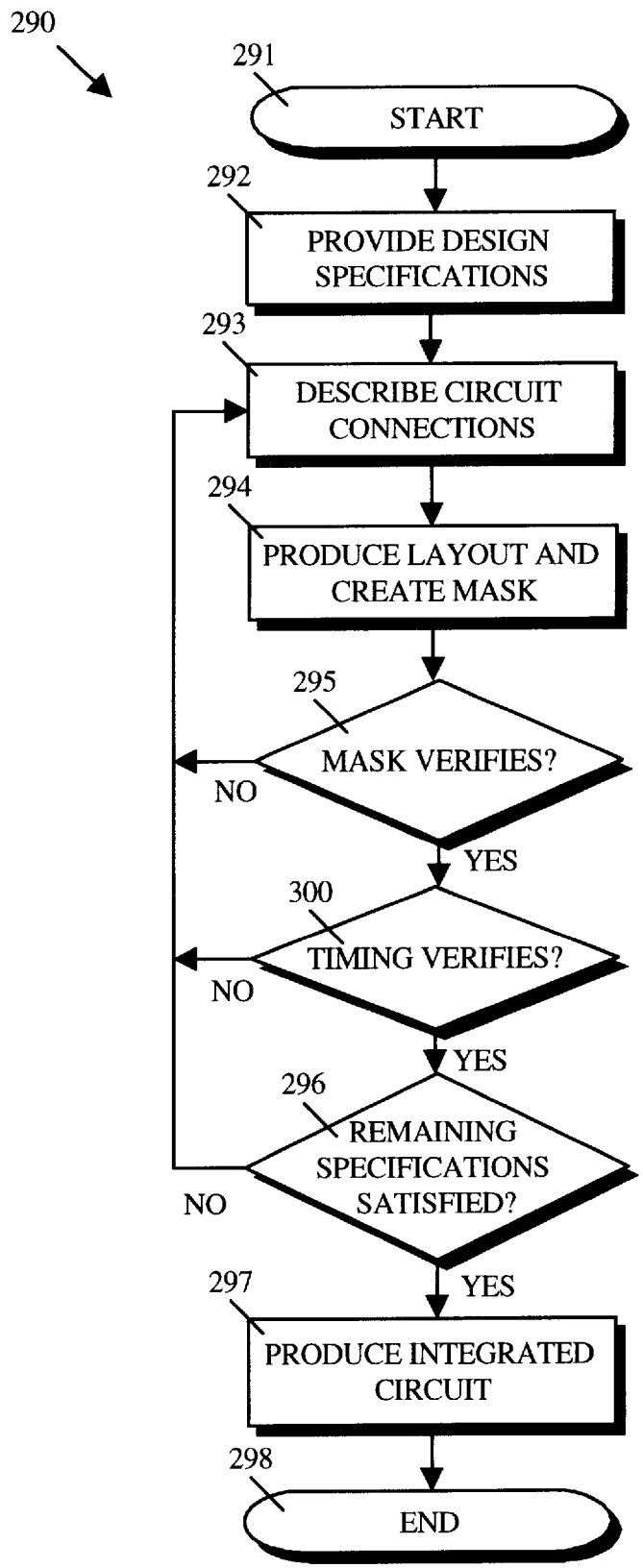
FIG. 4 is a flow diagram of a method of making an integrated circuit in accordance with the present invention.

FIG. 4 is a flow diagram showing an overview of an invention method 290 of making an electrical circuit beginning with a step 291. Step 292 provides design specifications for a proposed circuit. Design specifications can include a type of circuit to be constructed, timing requirements, distances between traces on an integrated circuit layer, other size requirements, chip size, overall power or speed requirements, logic functionality. Step 293 describes circuit connections to implement the design specifications. Step 293 includes determining what components are contained in the integrated circuit as well as how the components are connected to form the electrical circuit. Step 294 produces a circuit layout and mask. The mask may be used in photolithography to form a circuit on a printed circuit board or on a photosensitive substrate used in making an integrated circuit.

Step 295 verifies the mask. Mask verification can include checking aperture diameters and aperture spacings against the design specifications for lead diameters and lead spacings. For an integrated circuit, the leads may be parts of components and not merely connections between components. In addition, step 295 checks against unwanted aperture intersections which would result in unwanted connections in the circuit. If step 295 determines that the mask does not meet the design specifications, steps 293 and 294 are repeated.

If the mask meets the design specifications, step 300 verifies circuit timing. Step 300 verifies timing specifications included in the design specifications for the circuit. Step 300 can include calculating transmission delays along circuit conductors, and among combinations of the following: components, gates, input/output pads, input/output leads, etc. If step 295 determines that the mask does not meet the design specifications, steps 293, 294, and 295 are repeated.

If step 300 finds timing information which is within tolerances permitted by the timing specifications, any remaining design specifications not checked in steps 294 and 295 are checked in step 296. If step 296 determines the remaining design specifications are not met, then steps 293, 294, 295, and 300 are repeated.

If step 296 determines that the remaining design specifications are met, the circuit is produced in step 297. Circuit production includes using the mask in photolithography to form a printed circuit board or integrated circuit substrate. After the mask pattern has been etched in a printed circuit board, components are electrically connected to the printed circuit board to form the electrical circuit.

For an integrated circuit, various metalization and insulation layers are generally formed over the substrate instead. Usually, the integrated circuit has four or five metal layers with the top two layers covering the entire top of the integrated circuit. These top two layers carry signals and currents useful for the entire circuit. For example, these top layers can provide grounding and carry clock signals. Ideally, clock signals are provided to all parts of the integrated circuit. The top two layers are usually somewhat thicker than the other metallization layers and the wires are usually wider. Integrated circuit components are either formed on a single layer or by interconnecting parts of different layers. The method of making the circuit ends in a step 298.

Figure 5:
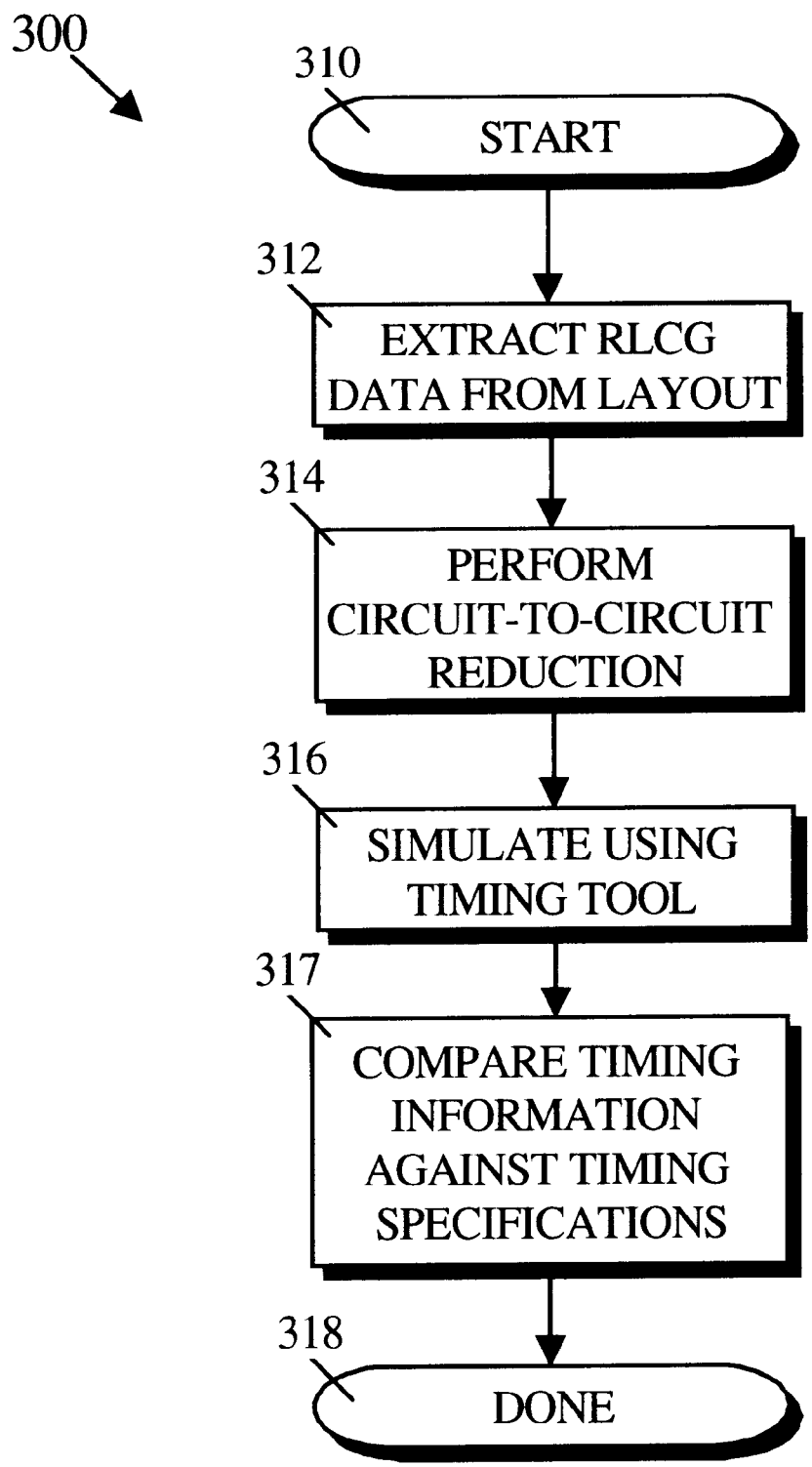
FIG. 5 is a flow diagram illustrating a preferred method of verifying timing specifications for an electrical circuit in accordance with the present invention.

FIG. 5 shows a flow diagram illustrating a preferred method 300 of verifying timing specifications for the electrical circuit in accordance with the present invention. The method 300 begins at step 310. Step 312 extracts resistance, capacitance, inductance and conductance data from layout data. Typically, an extractor program running on a computer, such as the hardware description processor 210, parses data in a layout file and selectively extracts the data for immediate use or for storage in other files in the digital storage for later steps.

Step 314 performs circuit-to-circuit reduction on the extracted data. As in conventional circuit-to-circuit reduction schemes, step 314 depicts electrical connections, lead traces, or wires in the electrical circuit as circuit elements such as resistors, capacitors, inductors, or conductances.

Those skilled in the art will appreciate that conductance is a mathematically equivalent way of describing a resistance. Conceptually, conductance measures how easily current flows rather than resistance which measures how current is impeded. Shunt resistances are often thought of as conductances to make mathematical circuit descriptions easier.

Figure 1A:
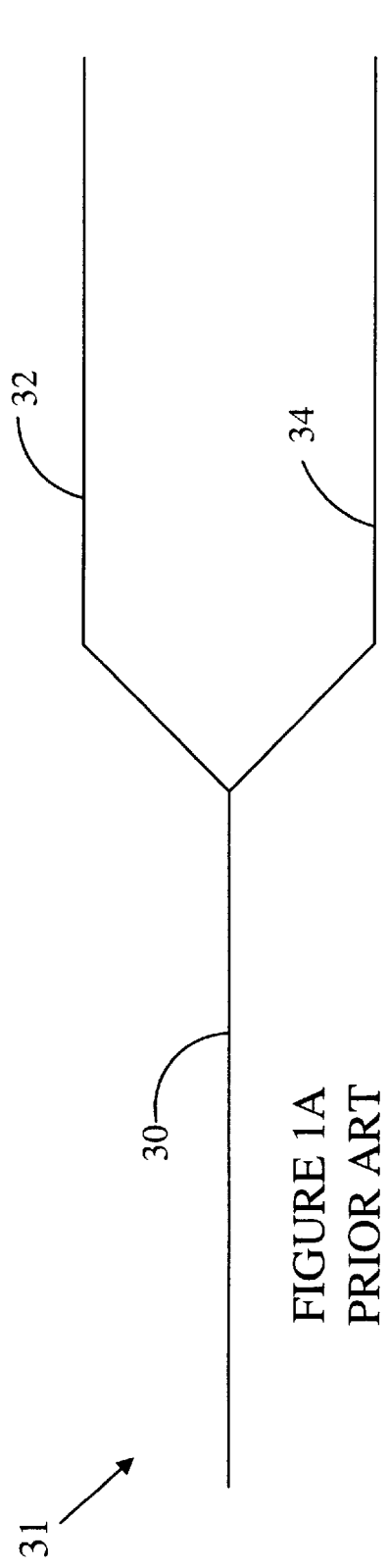
FIGS. 1A–C illustrate a conventional RC reduction.
Figure 1B:
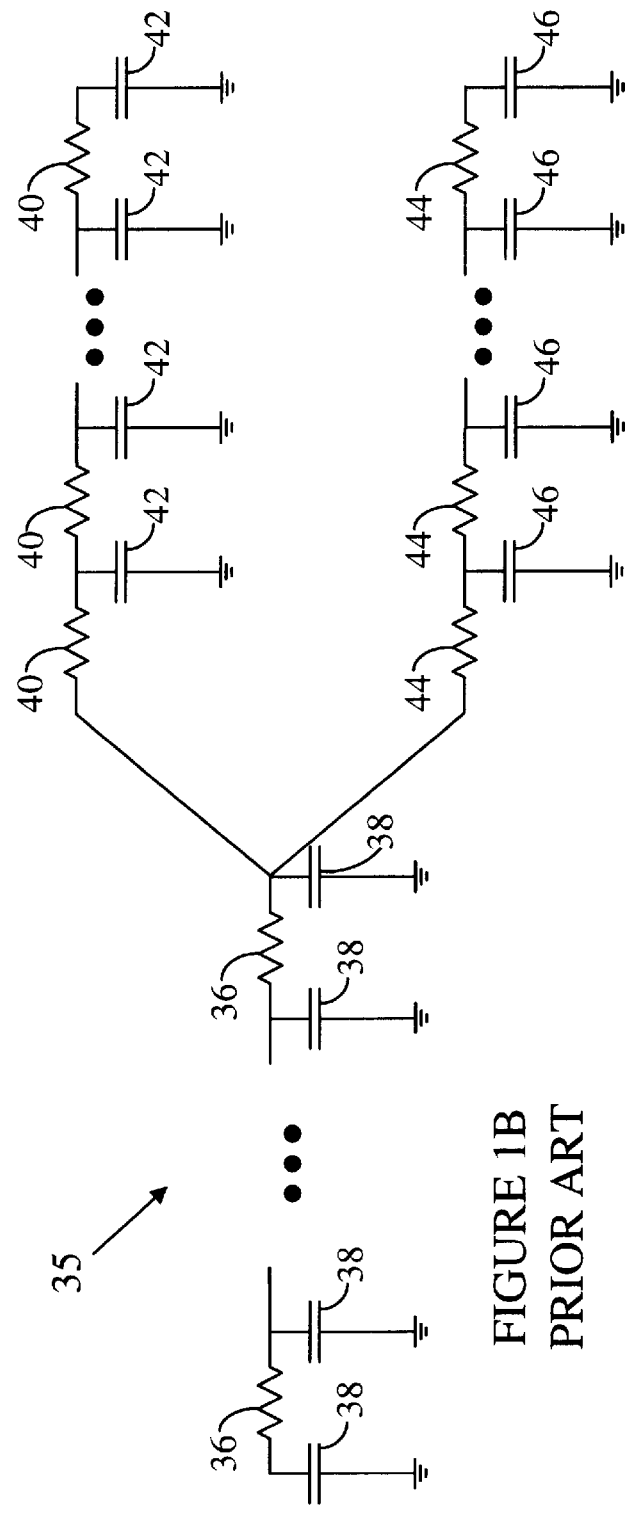

Each circuit element has an associated circuit element quantity. Associated circuit element quantities include resistance, capacitance, inductance, conductance. For an RC model, the circuit element quantities are simply the resistances and capacitances of the resistors 36, 40, 44 and capacitors 38, 42, 46 in the ladders in FIG. 1B. For the RLCG line 250 in FIG. 3A, the circuit element quantities are the values of the resistors 252(J), capacitors 256(J), inductors 262(J), and conductances 266(J), J=1, . . . , N.

Step 314 forms a representative circuit from the extracted data associated with the electrical circuit and having approximately the same performance as the electrical circuit described in the layout information. The representative circuit is represented on the computer in a computer language, such as SpectreHDL™ for analog circuits or Verilog for digital circuits, in a data file and/or on digital storage. The representative circuit represents a circuit using the circuit elements that would actually be manufactured along with the circuit element quantities corresponding to the electrical connections, wires, and lead traces. The representative circuit has approximately the same performance as the electrical circuit to be manufactured.

Step 314 calculates on the computer reduced quantities from the circuit element quantities. Generally fewer reduced quantities are calculated than the original number of circuit element quantities representing the electrical connections. However, the present invention can produce reductions with the same number of elements after reduction as before. The reduced quantities can be expressed in various formats such as Reduced SPICE™ or Reduced DSPF.

Step 316 uses the reduced quantities in a circuit simulation tool which runs on a computer. The simulation tool can be detailed or static. SPICE™ is an example of a detailed timing tool. Method 300 ends in a step 318. The circuit simulation tool on 316 can be a circuit simulator, delay calculator, or other timing verifier. Step 317 compares timing information obtained in 316 against the timing specifications obtained as part of the design specifications in step 292.

Figure 6:
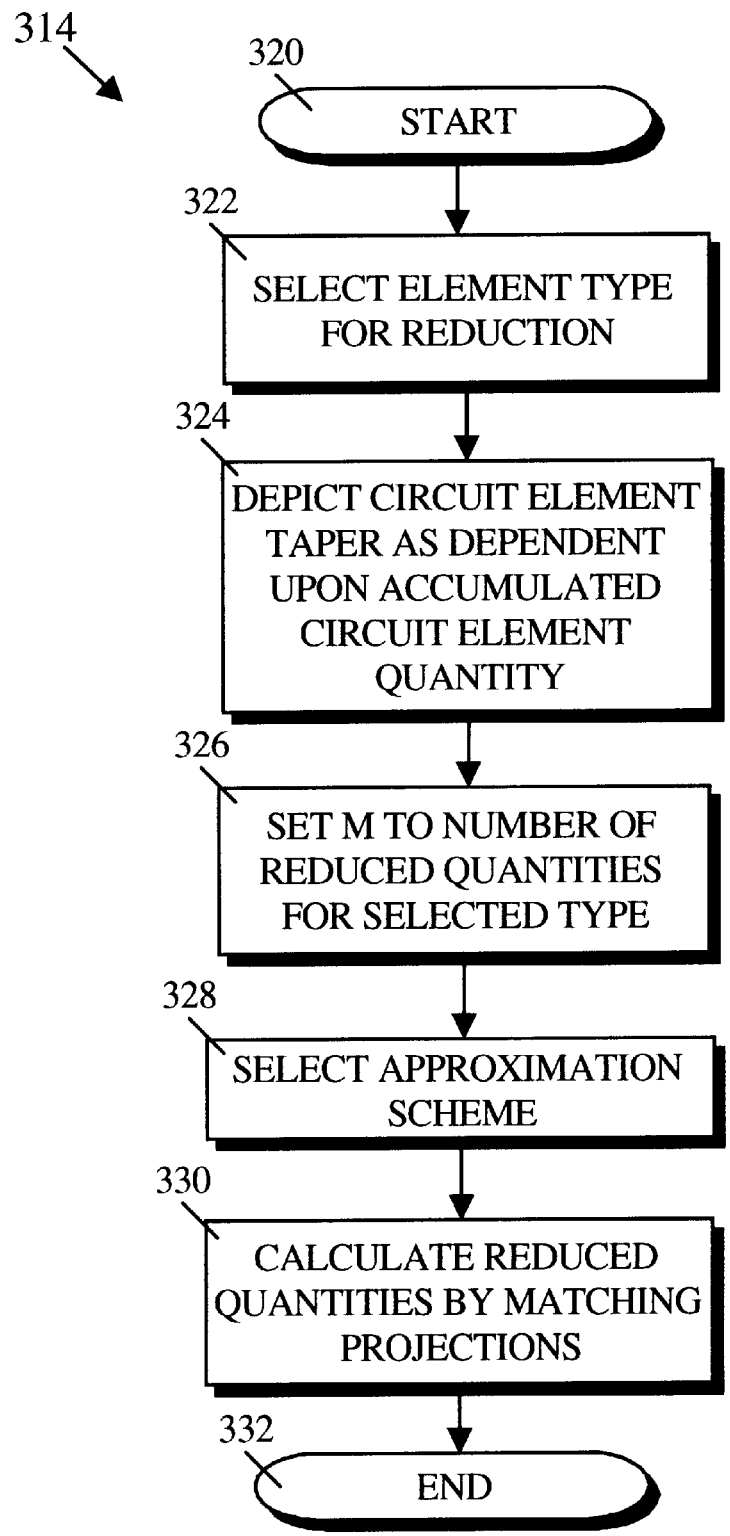
FIG. 6 is a flow diagram illustrating a preferred method of a step of FIG. 5 of performing circuit-to-circuit reduction in accordance with the present invention.

FIG. 6 illustrates a preferred embodiment of step 314 of circuit-to-circuit reduction in accordance with the present invention in more detail beginning at a step 320. Step 322 selects a component type for reduction. In the first example above with R as the accumulated circuit element quantity, L, C, and G can be component types selected for reduction. The selection can be made by a user input device such as the keyboard 216 or mouse which selects the type in a graphical user interface displayed on the monitor 218. Alternatively, computer software running on the computer may automatically select a type for reduction. This could be done through a loop sequentially selecting types.

Step 324 depicts on the computer the circuit element taper of the selected type as dependent upon the accumulated circuit element quantity. As noted above, the circuit element taper is a derivative of a distribution of a circuit element quantity. Distributed resistance and capacitance on a wire are examples of distributed circuit element quantities. The accumulated circuit element quantity is an integral of another distributed circuit element quantity.

Step 326 sets the number of reduced quantities of the selected type desired by the circuit-to-circuit reduction. The number of reduced quantities desired is required before the reduced quantities 282(I), 284(I), 286(I), and 288(I) can be calculated. For the special case of repetitive ladders or chains representing an RLCG line 250 where all the elements 252(J), 262(J), 256(J), and 266(J) are non-zero for each J, the number of sections is related to the number of reduced quantities in the reduced line. For repetitive ladders, the number of sections, N, will be one or two less, or one or two more, than the number of reduced quantities computed for the selected element type.

Figure 1C:
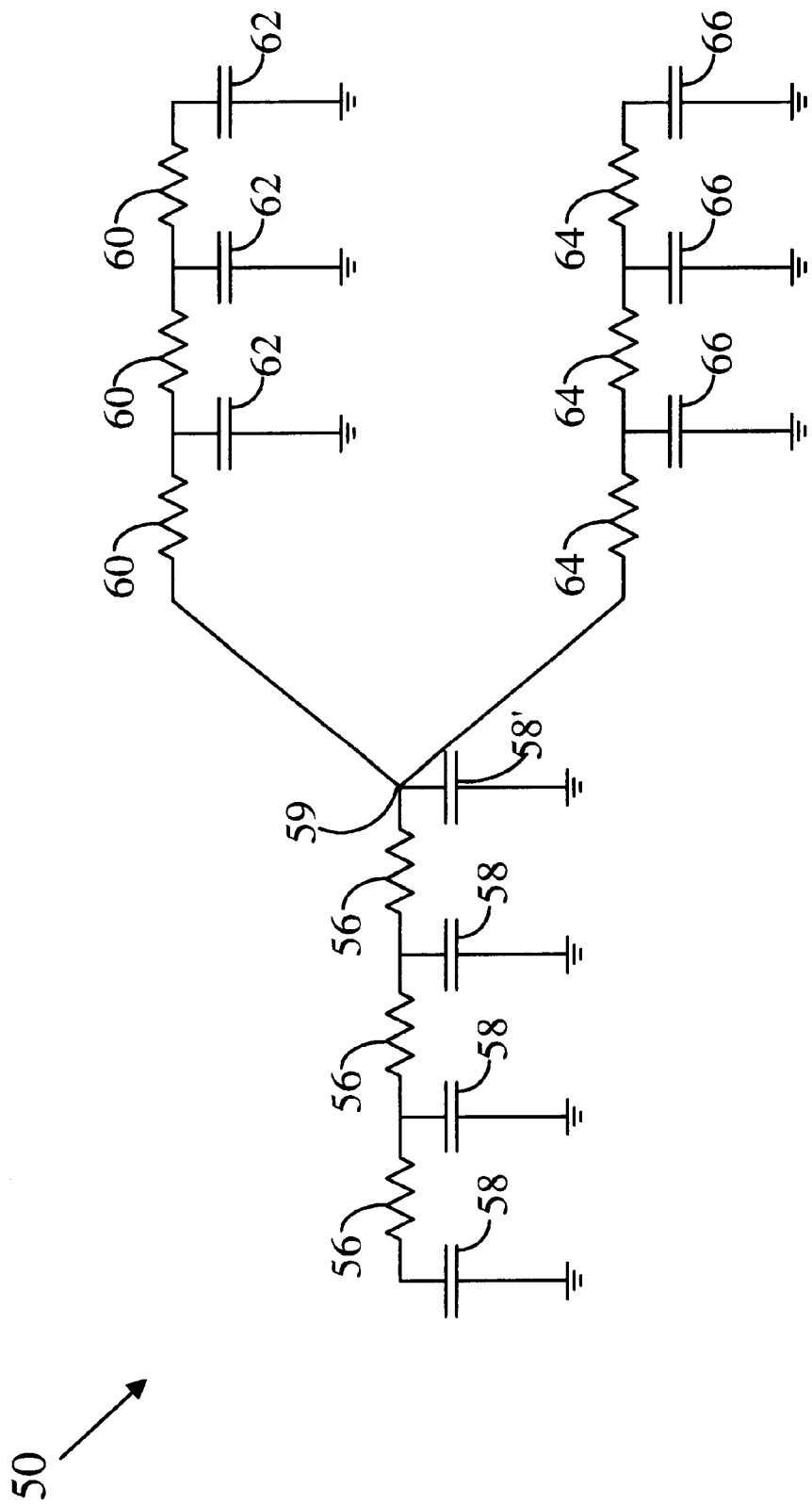

For example, in FIG. 1C, the capacitor 58' at the node 59 can be associated with either of the three wires 30, 32, 34. Then there are four reduced capacitances 58 and 58' for the reduced line for wire 30 having three sections. On the other reduced lines in FIG. 1C, the reduced capacitances 62 and 66 need not be placed at unconnected ends of the lines for wires 32 and 34. Then there would only be two reduced capacitances 62 and 66 for the three segments in each of the wires 32 and 34. In a preferred embodiment, the number of sections is an order of approximation m in a Gaussian quadrature approximation scheme.

The RLCG line 250 in FIG. 3A is generally not a ladder with a repetitive element structure because not all the elements in each section are required to be non-zero. Generally, the reduced RLCG line 280 will then not obey any preset rule relating the number for sections in the reduced line 280 to the number of reduced quantities of the selected type. The number of sections in the reduced RLCG line 280 in FIG. 3B is M.

Step 328 selects an approximation scheme to reduce the reduced quantities of the selected type. Suitable approximation schemes include, but are not limited to, projecting onto Fourier series or Haar basis functions and using Markov methods. Gaussian quadrature is presently preferred.

The computer calculates the reduced quantities for the selected component type in step 330 by matching projections of the circuit element taper with projections of the approximate taper. All these projections are in a function space. In a particularly useful projection, the function space is the space of polynomials. Then the projections are moments. In preferred embodiments, step 330 uses Gaussian quadrature to determine the moments in series approximating each of the reduced quantities. These moments are unrelated to the moments of conventional time verification schemes. The step 314 of circuit-to-circuit reduction ends at a step 332.

Figure 7:
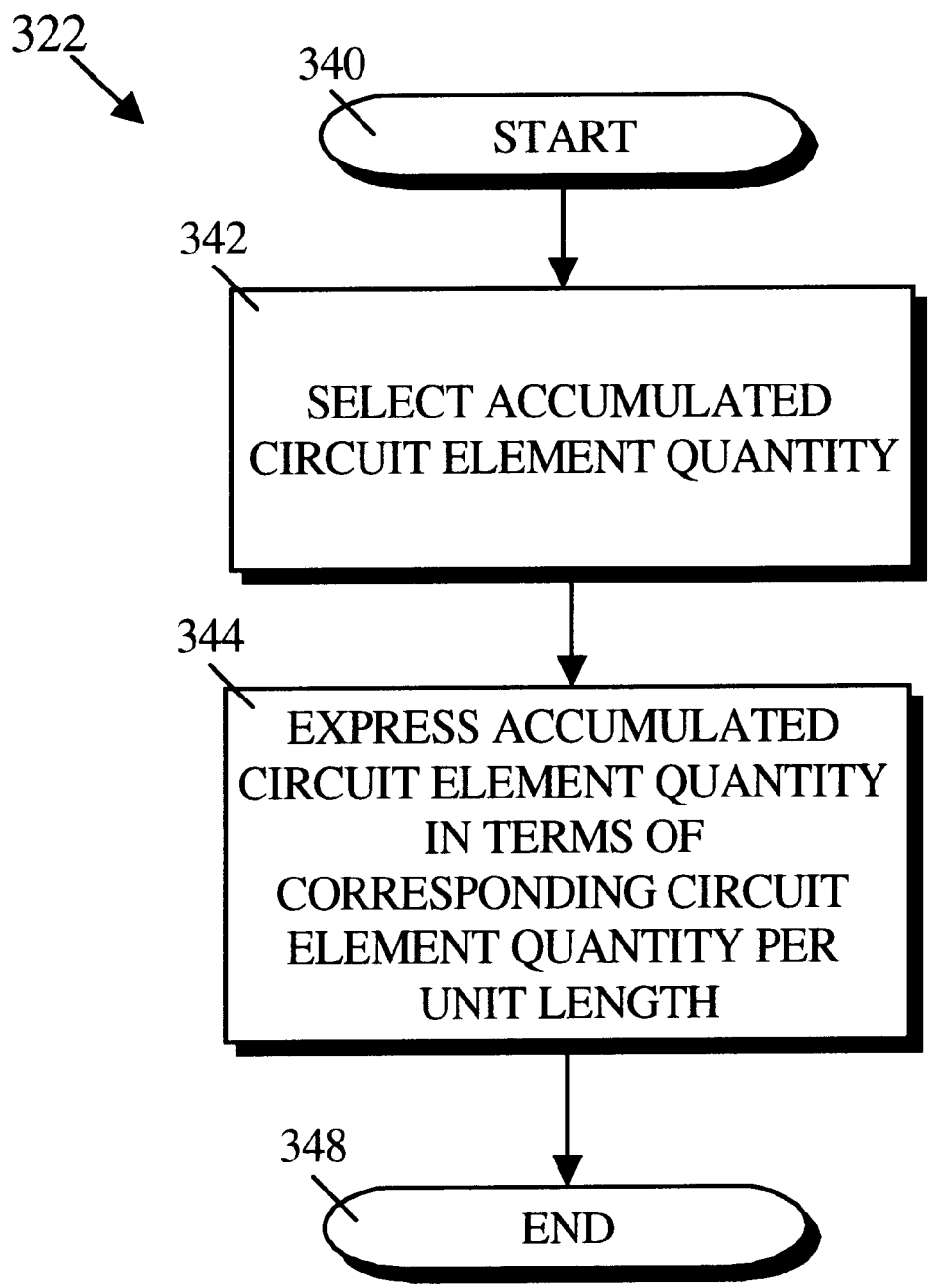
FIG. 7 is a flow diagram illustrating a preferred method for a step of FIG. 6 of selecting an element type for reduction in accordance with the present invention.

FIG. 7 illustrates step 322 of representing the circuit element quantities in more detail beginning at a step 340. Circuit element quantities satisfy standard transmission line differential equations for Laplace transforms of voltage and current:

$$\frac{dV(s,z)}{dz} = -[r(z)+sl(z)]I(s,z)$$

$$\frac{dI(s,z)}{dz} = -[g(z)+sc(z)]V(s,z)$$

where s is a complex frequency, z is a position along a transmission line or wire, r(z), l(z), g(z), and c(z) are per-unit-length series resistance, series inductance, parallel (shunt) conductance, and parallel (shunt) capacitance. ("Shunt" implies a connection to ground. For example, all the capacitors 38, 42, 46, 58, 62, and 66 are shunt capacitors.) Acceptable circuit element quantities are resistance, inductance, conductance, and capacitance. All these circuit element quantities are acceptable for selection in step 342.

An accumulated circuit element quantity is defined as an integral of a distribution of a corresponding quantity. For example, suppose z is zero at an end of the line. Suppose step 342 selects accumulated resistance as the accumulated circuit element quantity. The accumulated resistance R(z) is the total resistance between the end and a point at distance z from the end. R(z) is an integral with respect to y of the per-unit-length series resistance r(y) from zero to z:

$$R(z) = \int_0^z r(y)dy$$

Step 344 express the accumulated circuit element quantity in terms of the corresponding circuit element quantity per-unit length in this fashion.

Assuming r(y) is non-zero, the other non-zero circuit element quantities can be represented as depending upon R. R(z) always increases as z increases, i.e. is monotonic, because resistance distributed along the wire is always non-negative. Therefore, an inverse function z(R) is ensured to exist by the inverse function theorem. So, the other circuit element quantities may be represented as $$C(R) = \int_0^{z(R)} c(y)dy$$

$$L(R) = \int_0^{z(R)} l(y)dy$$

$$G(R) = \int_0^{z(R)} g(y)dy$$

where C(R) is the capacitance, L(R) is the inductance, and G(R) is the conductance. In this way, all circuit element quantities besides the accumulated circuit element quantity can be expressed in terms of the accumulated circuit element quantity.

Numerically, step 322 of representing the circuit element taper of the selected type as dependent upon an accumulated circuit element quantity can be performed in several ways. In a preferred embodiment, the circuit element quantities are numerical integrals of their corresponding per-unit-length values from zero to z(R). Given a table of values expressing R as a function of z, it is simple to expresses z as a function of R to obtain the upper limit of integration for the circuit element quantities. The numerical values of the circuit element quantities are used in later calculations below. Then, the circuit element taper is obtained by taking a numerical derivative. Step 322 of ends in step 348.

Using the well known chain rule to change variables in the transmission line equations from z to R results in two new equations $$\frac{dV}{dR} = -\left[1+s\frac{dL}{dR}\right]I$$

$$\frac{dI}{dR} = -\left[\frac{dG}{dR}+s\frac{dC}{dR}\right]V$$

These equations imply that a wire or wires with the same derivatives dL/dR, dG/dR, and dC/dR as the wire under consideration (e.g. wire 30) can replace the wire. The wire or wires are functionally equivalent to the wire under consideration. Solutions as a function of distance may not be the same. However, the solutions should match at ends of the wire or integration region, i.e. terminals, since changing variables between z and R does not affect the ends of the wires or integration regions. Other schemes for changing variables in the transmission line equations lead to the same conclusions regarding derivatives and equivalent wires. These equations are the mathematical foundation for using circuit element tapers instead of circuit element quantities in the reduction of the present invention.

Similar equations can be obtained for other selections of L, C, and G as the accumulated circuit element quantity. The special case of only resistances and capacitances, the RC case, can be obtained by setting L=G=0 in the above equations. Then, lines or wires with the same dC/dR are electrically equivalent. When L is the accumulated circuit element quantity, then the LC case of only inductances and capacitances yields the lossless transmission line equations $$\frac{dV}{dL} = -sI$$

$$\frac{dI}{dL} = -\left[s\frac{dC}{dL}\right]V$$

Figure 8:
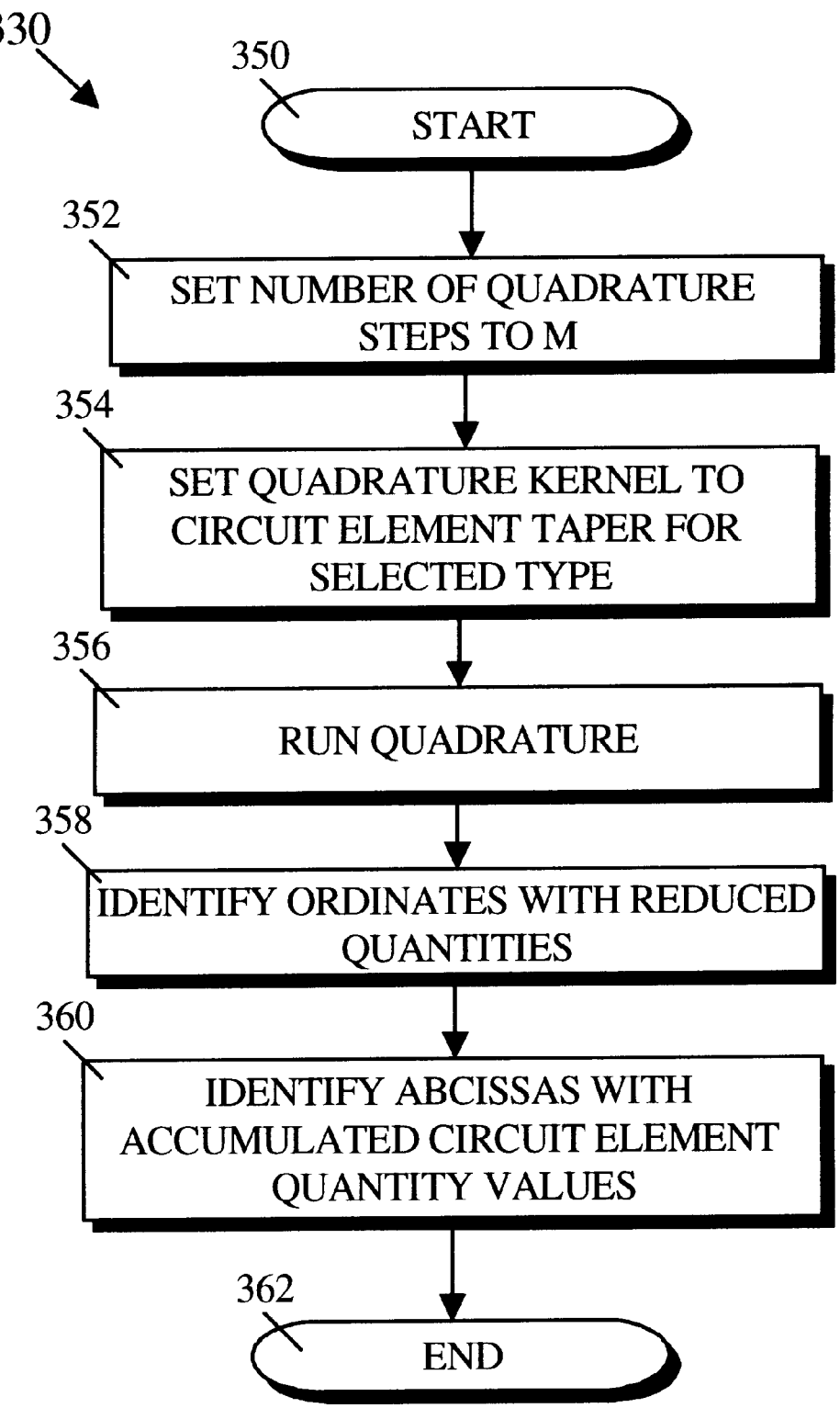
FIG. 8 is a flow diagram illustrating a preferred method for a step of FIG. 6 of calculating reduced quantities by matching projections in accordance with the present invention.

FIG. 8 is a flow diagram of an overview of a preferred embodiment of step 330 above when quadrature is the approximation scheme selected in step 328. The referred step 330 begins at step 350. A number of quadrature steps and an integration kernel are input to a Gaussian quadrature approximation for the reduced quantity of the selected type. The number of reduced quantities of the selected type, m, set in step 326 is now set to a number of quadrature steps in step 352. Step 354 sets the integration kernel to the circuit element taper of the selected component type. For example, suppose capacitance is the selected component type and R, accumulated resistance, is the accumulated circuit element quantity. Then, the quadrature integration kernel is c(R), the circuit element taper depicted as depending upon the accumulated circuit element quantity.

Step 356 runs the quadrature approximation to calculate the reduced quantities for the selected component type. For descriptive clarity, in the example of finding reduced capacitances, the accumulated resistance is the accumulated circuit element quantity. A goal of the quadrature approximation is to find an approximate capacitance per length, its "taper", whose moments agree with the first few moments of the actual taper. Restated, the reduced quantity is approximated by a sum of approximants where a number of terms in the sum is determined by an order of the approximation. The m variable relates the order of the approximation to a total number of reduced quantities of the selected element type.

The moment matching constraint just described is enforced by the equation $$\int_0^{R_t} \chi(R) R^k dR = \int_0^{R_t} c(R) R^k dR$$

Assuming that $\chi(R)$ is for lumped circuit capacitances approximated as placed at specified points on the line, then $\chi(R)$ has the form of a sum of Dirac delta functions centered at the specified points $$\chi(R) = \sum_i \chi_i \delta(R - \rho_i)$$

where $\chi_i$ is the value of an I-th lumped reduced capacitor (quantity) positioned $\rho_i$ away from the end of the line.

Gaussian quadrature is a procedure for approximating integrals by weighted sums. An integral of a generic function f(x) multiplied by a weighting function w(x) is approximated as a discrete sum of products of weights $w_i$ and values of f(x) at discrete points $x_i$ $$\int_a^b w(x) f(x) dx \approx \sum_i w_i f(x_i) = \int_a^b \sum_i w_i \delta(x - x_i) f(x) dx$$

The Gaussian quadrature procedure finds the weights $w_i$, also termed "ordinates", and discrete points $x_i$, also termed "abscissas" for I=1, . . . , m. This quadrature approximation is exact when f(x) is a polynomial of order less than or equal to (2m−1).

Therefore, in the preferred embodiment, the moment constraint above for the RC example may be enforced by applying the Gaussian quadrature rule with w(x)=c(R), a=0, and b=R. The ordinates $w_i$ are identified as the I-th lumped capacitor value $\chi_i$, and the corresponding abscissas $x_i$ are identified as the position $\rho_i$ of the I-th lumped capacitor on the line.

By definition of the accumulated circuit element quantity, the determination of the positions $\rho_i$ directly implies a reduction for the accumulated circuit element quantity. In the example, reduced lumped resistances are at the positions $\rho_i$.

A general scheme for performing Gaussian quadrature is now presented. Only an overview of the procedure is presented here. A set of m orthogonal polynomials to serve as a basis for f(R) are found. The polynomials are orthogonal with respect to a function inner product defined by $$(f, g) \equiv \int_a^b w(x) f(x) g(x) dx$$

A preferred orthogonalization method is the Gram-Schmidt procedure, well-known to those skilled in the art. In pseudo-code, the Gram-Schmidt procedure is Initialize $p_0(x) = 1$, $p_{-1}(x) = 0$, $\gamma_1^2 = 0$.

For $(I = 1$ to $I = m)${

Set $\delta_{i+1} = (x p_i, p_i)/(p_i, p_i)$.

If $I > 0$, set $\gamma_{i+1}^2 = (p_i, p_i)/(p_{i-1}, p_{i-1})$.

Set $p_{i+1}(x) = (x - \delta_{i+1}) p_i(x) - \gamma_{i+1}^2 p_{i-1}(x)$.

}

The resulting $p_j(x)$ for j=1, . . . , m are an orthogonal set of polynomials.

The gammas and deltas are entries in a tridiagonal matrix $$J = \begin{bmatrix} \delta_1 & \gamma_1 & 0 & \ldots & \ldots & 0 \\ \gamma_2 & \delta_2 & \gamma_2 & 0 & \ldots & 0 \\ \vdots & & & & & \vdots \\ 0 & \ldots & 0 & \gamma_{m-1} & \delta_{m-1} & \gamma_m \\ 0 & \ldots & \ldots & 0 & \gamma_m & \delta_m \end{bmatrix}$$

The eigenvalues of J are the abscissas $x_i$. The square of the first component of the corresponding, normalized eigenvectors are the weights $w_i$.

Unlike conventional methods, the reduced RLCG line 280 and the electrical circuit containing it are stable provided the kernel c(R) satisfies certain regularity conditions required by the quadrature approximation. Then, the reduced quantities $\chi_i$ are positive. The regularity conditions ensure that the function inner product is non-negative and $\gamma_{l+1}^2 > 0$; The restriction of m being less than or equal to the original number of segments before reduction guarantees $(p_{i-1}, p_{i-1}) > 0$. Thus, the invention method produces a stable reduced circuit model for virtually all c(R)'s of practical interest.

Assuming reuse of inner products, the computational cost of Gram-Schmidt orthogonalizations for the present situation for an n capacitor RC line to an m capacitor reduced RC line is about 2 n operations or "flops" for each delta calculation and about 2 n more flops for the recursive polynomial calculation. This makes a total of about 4 mn flops. Finding the weights and abscissas of J by a symmetric QR algorithm requires about 24 $m^2$ flops. The total Gaussian quadrature calculation requires about 4 mn+24 $m^2$ flops. In practice, n is greater than m by a large enough number margin that the number of flops is approximately 4 mn.

Essentially, Gaussian quadrature is used here to enforce the moment matching constraint rather than generate a quadrature rule for evaluating integrals of the form.

$$\int_a^b c(R)f(R)dR$$

for arbitrary functions f(R). For this reason, the error in the sum $$\chi(R) = \sum_i \chi_i \delta(R - \rho_i)$$

as calculated by Gaussian quadrature depends only on how good an approximation moment matching is for c(R) and how errors in $\chi(R)$ affect circuit responses as in timing verification. In particular, the Gaussian quadrature matches the first (2m−1) moments of c(R) and $\chi(R)$. The moment matching is particularly useful since c(R) is monotonic. On the other hand, the moment matching is to the impulsive function $\chi(R)$. This results in a staircase approximation to C(R).

Returning now to FIG. 8, step 358 identifies ordinates with $\chi_i$, and step 360 identifies abscissas with $\rho_i$. Step 330 of calculating the reduced quantities for the selected component type ends in step 362.

Figure 9:
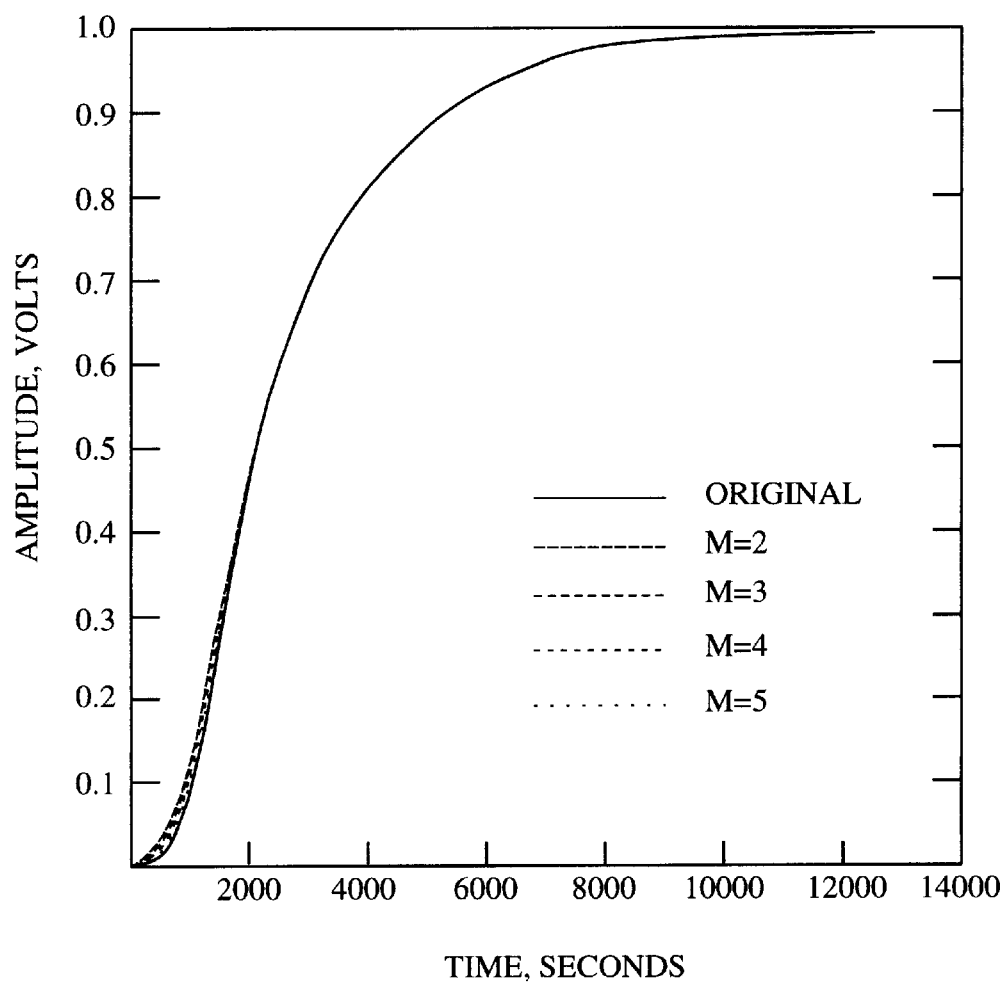
FIG. 9 is a graph of voltage responses for an RC line and reduced RC lines obtained by the present invention.

FIG. 9 is a graph of output voltage response for a ladder having 100 capacitors and 101 1 ohm resistors. Each capacitor has a one farad capacitance, and each resistor has a one ohm resistance. The graph compares a response curve for the original ladder (RLCG line) with four curves for four total numbers of sections on the reduced RC (RLCG) line: 2, 3, 4, 5. All the curves are practically identical. Times depicted in FIG. 9 are large compared with most problems of interest because of the large 1 farad capacitances.

Figure 10:
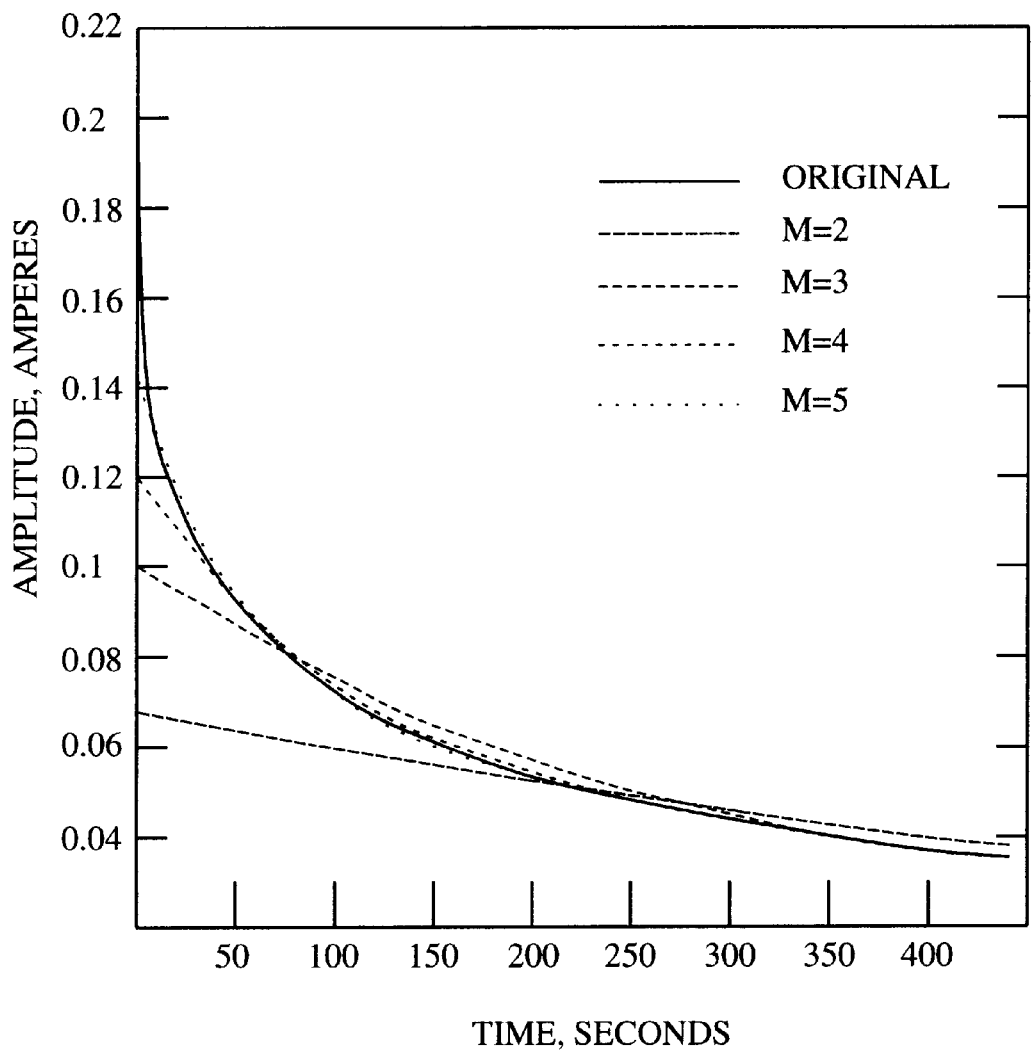
FIG. 10 is a graph of current responses for an RC line and reduced RC lines obtained by the present invention.

FIG. 10 shows an input current response for for the original RC line compared with the input current response generated for the same four total number of sections in the reduced line. Again, very good results are obtained for a very small number of reduced quantities (reduced circuit elements).

While this invention has been described in terms of several preferred embodiments, it is contemplated that alterations, modifications and permutations thereof will become apparent to those skilled in the art upon a reading of the specification and study of the drawings. For example, other projection bases for the circuit element tapers and approximate tapers may replace the polynomial basis presented. The present invention can be applied to couplings between wires. Additionally, the present invention can be applied to lines, ladders, and circuits with more complicated elements that resistors, capacitors, inductors, and conductances. For example, wire performance tends to degrade at higher frequencies due to the well-known skin effect. One approach to modeling the degradation uses circuit elements with corresponding circuit element quantities dependent upon frequency. These frequency dependent circuit element quantities can be manipulated just as the resistors, capacitors, inductors, and conductances. Furthermore, certain terminology has been used for the purposes of descriptive clarity, and not to limit the present invention. It is therefore intended that the following appended claims include all such alterations, modifications and permutations as fall within the true spirit and scope of the present invention.

What is claimed is:

1. A method of simulating an electrical circuit design, the method comprising the steps of:

providing design specifications for an electrical circuit design including timing specifications;

describing on a computer circuit element quantities and circuit connections for said electrical circuit design such that said computer description contains a description of an RLCG line within said electrical circuit design; and verifying said timing specifications for said electrical circuit design by circuit-to-circuit reduction having the steps of:

depicting a circuit element taper of a selected element type as dependent upon an accumulated circuit element quantity; and matching projections of said circuit element taper with projections of an approximate taper, said approximate taper dependent upon said accumulated circuit element quantity, to obtain on said computer at least one reduced quantity for circuit element quantities of said selected element type such that said at least one reduced quantity can be arranged in a reduced RLCG line having approximately the same performance as said RLCG line; and simulating on said computer performance of a reduced circuit containing said reduced RLCG line to obtain timing information about said electrical circuit design.

2. A method according to claim 1 wherein said electrical circuit design is a design of an integrated circuit having a semiconductor die having one of a plurality of I/O pads, a package enclosing said semiconductor die, a plurality of leads extending from said package, and a plurality of conductors coupling said plurality of I/O pads of said semiconductor die to said plurality of leads.

3. A method according to claim 1 further comprising the steps of:

laying out at least a portion of said electrical circuit design on said computer; and creating at least one integrated circuit mask based upon said laying out step;

where said integrated circuit is produced, at least in part, with said at least one circuit mask.

4. A method as recited in claim I wherein said matching step includes:

approximating said at least one reduced quantity by a sum of approximants, a number of terms in said sum of approximants determined by an order of an approximation; and relating said order of said approximation to a total number of said circuit element quantities of said selected element type.

5. A method as recited in claim 4 wherein said matching step includes the step of performing a quadrature approximation on said projections of said approximate taper to obtain said approximants.

6. A method as recited in claim 5 wherein a number of steps in said quadrature equals said total number of said circuit element quantities of selected type.

7. A method as recited in claim 5 wherein a kernel for said quadrature is said circuit element taper.

8. A method as recited in claim 5 wherein said matching step includes the step of identifying ordinates of said quadrature approximation with said at least one reduced quantity.

9. A method as recited in claim 5 wherein said matching step includes the step of identifying abscissas of said quadrature approximation with values of said accumulated circuit element quantity corresponding to where said at least one reduced quantity is located along said reduced RLCG line.

10. A method of RLCG line reduction in a circuit design, the method comprising the steps:

depicting a circuit element taper of a selected element type as dependent upon an accumulated circuit element quantity; and matching projections of said circuit element taper with projections of an approximate taper, said approximate taper dependent upon said accumulated circuit element quantity, to obtain on a computer at least one reduced quantity for circuit element quantities of said selected element type in an RLCG line such that said at least one reduced quantity can be arranged in a reduced RLCG line having approximately the same performance as said RLCG line.

11. A method as recited in claim 10 further comprising a step of expressing said accumulated circuit element quantity in terms of an associated circuit element quantity per unit length such that said accumulated circuit element quantity has a direct correspondence with distance along said RLCG line.

12. A method as recited in claim 11 wherein said projections of said circuit element taper and said projections of said approximate taper are moments.

13. A method as recited in claim 12 wherein said matching step includes the steps of:

approximating said at least one reduced quantity by a sum of approximants, a number of terms in said sum of approximants determined by an order of an approximation; and relating said order of said approximation to a total number of said circuit element quantities of said selected element type.

14. A method as recited in claim 13 wherein said matching step includes the step of performing a quadrature approximation on said moments of said approximate taper to obtain said approximants.

15. A method as recited in claim 14 wherein a number of steps in said quadrature equals said total number of said circuit element quantities of said selected element type.

16. A method as recited in claim 14 wherein a kernel for said quadrature is said circuit element taper.

17. A method as recited in claim 14 wherein said matching step includes the step of identifying ordinates of said quadrature approximation with said at least one reduced quantity.

18. A method as recited in claim 14 wherein said matching step includes the step of identifying abscissas of said quadrature approximation with values of said accumulated circuit element quantity corresponding to where said at least one reduced quantity is located along said reduced RLCG line.

19. A computer based system for simulating an electrical circuit design comprising:

a processor including a central processing unit (CPU), digital storage coupled to said CPU, and a user input device coupled to said CPU operable to describe circuit element quantities and circuit connections for an electrical circuit design from design specifications for a circuit design, said design specifications including timing specifications and a description of an RLCG line within said electrical circuit design, said processor verifying said timing specifications for said electrical circuit design by circuit-to-circuit reduction by depicting a circuit element taper of a selected element type as dependent upon an accumulated circuit element quantity, matching projections of said circuit element taper with projections of an approximate taper, said approximate taper dependent upon said accumulated circuit element quantity, to obtain at least one reduced quantity for circuit element quantities of said selected element type such that said at least one reduced quantity can be arranged in a reduced RLCG line having approximately the same performance as said RLCG line, simulating on said computer performance of a reduced circuit containing said reduced RLCG line to obtain timing information about said electrical circuit design, comparing said timing information against said timing specifications, and storing said associated mask data for said electrical circuit design on said digital storage.

20. A system as claimed in claim 19 wherein said matching performed by said processor includes:

approximating said at least one reduced quantity by a sum of approximants, a number of terms in said sum of approximants determined by an order of an approximation; and relating said order of said approximation to a total number of said circuit element quantities of said selected element type.

21. A system as claimed in claim 20 wherein said matching performed by said processor includes performing a quadrature approximation on said projections of said approximate taper to obtain said approximants.

22. A system as claimed in claim 21 wherein a number of steps in said quadrature performed by said processor equals said total number of said circuit element quantities of selected type.

23. A system as claimed in claim 21 wherein a kernel for said quadrature performed by said processor is said circuit element taper.

24. A system as claimed in claim 21 wherein said matching performed by said processor includes identifying ordinates of said quadrature approximation with said at least one reduced quantity.

25. A system as claimed in claim 21 wherein said matching performed by said processor includes identifying abscissas of said quadrature approximation with values of said accumulated circuit element quantity corresponding to where said at least one reduced quantity is located along said reduced RLCG line.

26. A computer program embodied in a tangible medium and capable of being read by a computer, for performing the steps of:

depicting a circuit element taper of a selected element type as dependent upon an accumulated circuit element quantity; and matching projections of said circuit element taper with projections of an approximate taper, said approximate taper dependent upon said accumulated circuit element quantity, to obtain on a computer at least one reduced quantity for circuit element quantities of said selected element type in an RLCG line such that said at least one reduced quantity can be arranged in a reduced RLCG line having approximately the same performance as said RLCG line.

27. A computer program according to claim 26, further comprising the step of expressing said accumulated circuit element quantity in terms of an associated circuit element quantity per unit length such that said accumulated circuit element quantity has a direct correspondence with distance along said RLCG line.

28. A computer program according to claim 27 wherein said projections of said circuit element taper and said projections of said approximate taper are moments.

29. A computer program according to claim 28 wherein said matching includes the steps of:

approximating said least one reduced quantity by a sum of approximants, a number of terms in said sum of approximants determined by an order of an approximation; and relating said order of said approximation to a total number of said circuit element quantities of said selected element type.

30. A computer program according to claim 29 wherein said matching includes the step of performing a quadrature approximation on said moments of said approximate taper to obtain said approximants.

31. A computer program according to claim 30 wherein a number of steps in said quadrature equals said total number of said circuit element quantities of said selected element type.

32. A computer program according to claim 30 wherein a kernel for said quadrature is said circuit element taper.

33. A computer program according to claim 30 wherein said matching includes the step of identifying ordinates of said quadrature approximation with said at least one reduced quantity.

34. A computer program according to claim 30 wherein said matching includes the step of identifying abscissas of said quadrature approximation with values of said accumulated circuit element quantity corresponding to where said at least one reduced quantity is located along said reduce RLCG line.

* * * * *